United States Patent
Huang

(10) Patent No.: US 11,210,974 B2
(45) Date of Patent: Dec. 28, 2021

(54) DRIVING CIRCUIT OF DISPLAY APPARATUS

(71) Applicant: HKC Corporation Limited, Shenzhen (CN)

(72) Inventor: Xiaoyu Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 466 days.

(21) Appl. No.: 16/334,176

(22) PCT Filed: Nov. 21, 2018

(86) PCT No.: PCT/CN2018/116593
§ 371 (c)(1),
(2) Date: Mar. 18, 2019

(87) PCT Pub. No.: WO2020/093447
PCT Pub. Date: May 14, 2020

(65) Prior Publication Data
US 2021/0335161 A1    Oct. 28, 2021

(30) Foreign Application Priority Data

Nov. 9, 2018    (CN) .......................... 201811332295.7

(51) Int. Cl.
*G09G 3/00* (2006.01)
*G09G 3/20* (2006.01)
*H03K 3/037* (2006.01)

(52) U.S. Cl.
CPC ............... *G09G 3/006* (2013.01); *G09G 3/20* (2013.01); *H03K 3/037* (2013.01)

(58) Field of Classification Search
CPC ........... G09G 3/006; G09G 3/20; H03K 3/037
See application file for complete search history.

(56) References Cited

FOREIGN PATENT DOCUMENTS

| CN | 106157915 | * | 11/2016 |
| CN | 108615490 | * | 2/2018 |

* cited by examiner

*Primary Examiner* — Mark W Regn
(74) *Attorney, Agent, or Firm* — Juan Carlos A. Marquez; Marquez IP Law Office, PLLC

(57) ABSTRACT

This application provides a driving circuit including a switching module, a control unit, a first switch, and a voltage adjusting module. A first input line of the switching module receives a first signal. When a control signal of the control unit is at a first potential, the switching module to enable an output line to electrically communicate with a first input line, and an output signal of the output line is equal or close to the first signal. When the control signal is at a second potential, the switching module to enable the output line to electrically communicate with a second input line, the first switch is turned on, the voltage adjusting module adjusts the first signal to a second signal and outputs the second signal to the second input line, and the output signal of the output line is equal or close to the second signal.

17 Claims, 6 Drawing Sheets

DRIVING CIRCUIT OF DISPLAY APPARATUS

BACKGROUND

Technical Field

This application relates to the display technology field of display apparatuses, and in particular, to a driving circuit of a display apparatus.

Related Art

Currently, thin film transistor liquid crystal displays (Thin film transistor liquid crystal display, TFT-LCD) are a main type of products for flat-panel displaying, and have become important display platforms for video products in modern networks. A main driving principle is that a system mainboard connects a color (such as red/green/blue, (R/GB)) compression signal, a control signal, and a power supply to a connector on a printed circuit board (PCB) by using lines. Data is processed by a timing controller (TCON) IC on the printed circuit board, and then is connected to a display area by using the printed circuit board, a source driving circuit (Source-Chip on Film, S-COF), and a gate driving circuit (Gate-Chip on Film, G-COF), so that a display obtains the power supply and the signals required for presenting an image.

However, a gate turn-on voltage is a fixed value. To explore the product quality, the gate turn-on voltage needs to be increased to perform a quality test in a display panel production process. In an existing solution, to achieve the objective, a switching circuit needs to be added based on a driving circuit. According to this solution, the production costs increase and the occupied space on the panel becomes larger.

SUMMARY

To resolve the foregoing technical problems, an objective of this application is to provide a driving circuit of a display apparatus, so that a gate turn-on voltage is increased to perform a quality test in a display panel production process, to satisfy a requirement of a customer.

The objective of this application is achieved and the technical problems of this application are resolved by using the following technical solution. A driving circuit of a display apparatus provided according to this application comprises: a switching module, comprising a control line, a first input line, a second input line, and an output line; a control unit, where an output end of the control unit is connected to the control line of the switching module; a first switch, where a control end of the first switch is connected to the control line of the switching module, and a first end of the first switch is connected to the first input line of the switching module; and a voltage adjusting module, connected between a second end of the first switch and the second input line of the switching module.

The first input line of the switching module is electrically coupled to a first signal, the control unit provides a control signal, and when the control signal is at a first potential, the switching module performs circuit switching to enable the output line of the switching module to electrically communicate with a first input line of the switching module, and an output signal of the output line of the switching module is equal or close to the first signal. When the control signal is at a second potential, the switching module performs circuit switching to enable the output line of the switching module to electrically communicate with the second input line of the switching module, the first switch is turned on, the voltage adjusting module adjusts the first signal to a second signal and outputs the second signal to the second input line of the switching module, and the output signal of the output line of the switching module is equal or close to the second signal.

In an embodiment of this application, the switching module comprises: a second switch, where a first end of the second switch is the first input line of the switching module, and a second end of the second switch is connected to the output line of the switching module; and a third switch, where a first end of the third switch is the second input line of the switching module, and a second end of the third switch is connected to the output line of the switching module. Control ends of the second switch and the third switch have opposite polarities, and are connected to the control line of the switching module.

In an embodiment of this application, polarities of control ends of the first switch and the third switch are the same.

In an embodiment of this application, the control unit is a flip-flop, the flip-flop comprises a digital signal input end, a trigger signal input end, and a signal output end, the signal output end of the flip-flop is connected to the control line of the switching module, the digital signal input end receives an input signal, and the trigger signal input end receives a pulse signal.

In an embodiment of this application, when the pulse signal is at a third potential, the digital signal input end assigns the input signal to the signal output end of the flip-flop, and the signal output end of the flip-flop outputs the input signal.

In an embodiment of this application, when the pulse signal is at a fourth potential, the signal output end of the flip-flop has no output.

In an embodiment of this application, the flip-flop is a D-type flip-flop.

In an embodiment of this application, the first switch and the third switch are P-type field-effect transistors, and the second switch is an N-type field-effect transistor.

In an embodiment of this application, the first potential is a high potential, and the second potential is a low potential.

In an embodiment of this application, the first switch and the third switch are N-type field-effect transistors, and the second switch is a P-type field-effect transistor.

In an embodiment of this application, the first potential is a low potential, and the second potential is a high potential.

In an embodiment of this application, both the first signal and the second signal are voltage signals, and a voltage of the first signal is higher than a voltage of the second signal.

The objective of this application may further be achieved and the technical problems of this application may further be resolved by using the following technical measures.

A driving circuit of a display apparatus provided according to this application includes: a flip-flop, comprising a digital signal input end, a trigger signal input end, and a signal output end, where the digital signal input end receives an input signal, and the trigger signal input end receives a pulse signal; a first switch, where a first end of the first switch is connected to a first node, and a control end of the first switch is connected to the signal output end; a second switch, where a first end of the second switch is connected to the first node, a control end of the second switch is connected to the signal output end, and a second end of the second switch is connected to the second node; a third switch, where a control end of the third switch is connected to the signal output end, and a second end of the third switch is connected to the second node; and a voltage adjusting module, where an input end of the voltage adjusting module is connected to a second end of the first switch, and an output end of the voltage adjusting module is connected to a first end of the third switch.

The first node is electrically coupled to a first signal, and the second node is electrically coupled to an output signal. the first node obtains the first signal, the pulse signal is at a high potential, the signal output end of the flip-flop outputs the input signal, and when the input signal is at a high potential, the second switch is turned on, the first switch and the third switch are turned off, and the first signal is transmitted to the second node through the second switch. When the input signal is at a low potential, the first switch and the third switch are turned on, the second switch is turned off, the first signal is adjusted by the voltage adjusting module to a second signal, and the second signal is transmitted to the second node through the third switch. When the pulse signal is at a low potential, the signal output end of the flip-flop has no output.

In an embodiment of this application, the flip-flop is a D-type flip-flop.

In an embodiment of this application, the first switch and the third switch are P-type field-effect transistors, and the second switch is an N-type field-effect transistor.

In an embodiment of this application, both the first signal and the second signal are voltage signals, and a voltage of the first signal is higher than a voltage of the second signal.

In an embodiment of this application, the voltage adjusting module comprises: a first resistor, where a first end of the first resistor is connected to the second end of the first switch, and a second end of the first resistor is connected to the first end of the third switch; and a second resistor, where a first end of the second resistor is connected to the second end of the first resistor, and a second end of the second resistor is grounded.

According to this application, a gate turn-on voltage is increased to perform an aging test on a display panel without greatly changing a production process, thereby improving the product quality and reduce the production costs.

DETAILED DESCRIPTION

The following embodiments are described with reference to the accompanying drawings, used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In the figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. It should be understood that when a component such as a layer, a film, an area, or a base is described to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout the specification, "on" means that one is located above or below a target component and does not necessarily mean that one is located on the top based on a gravity direction.

To further describe the technical measures taken in this application to achieve the intended invention objective and effects thereof, specific implementations, structures, features, and effects of a new gate turn-on voltage driving architecture provided according to this application are described below in detail with reference to the drawings and specific embodiments.

Figure 1:
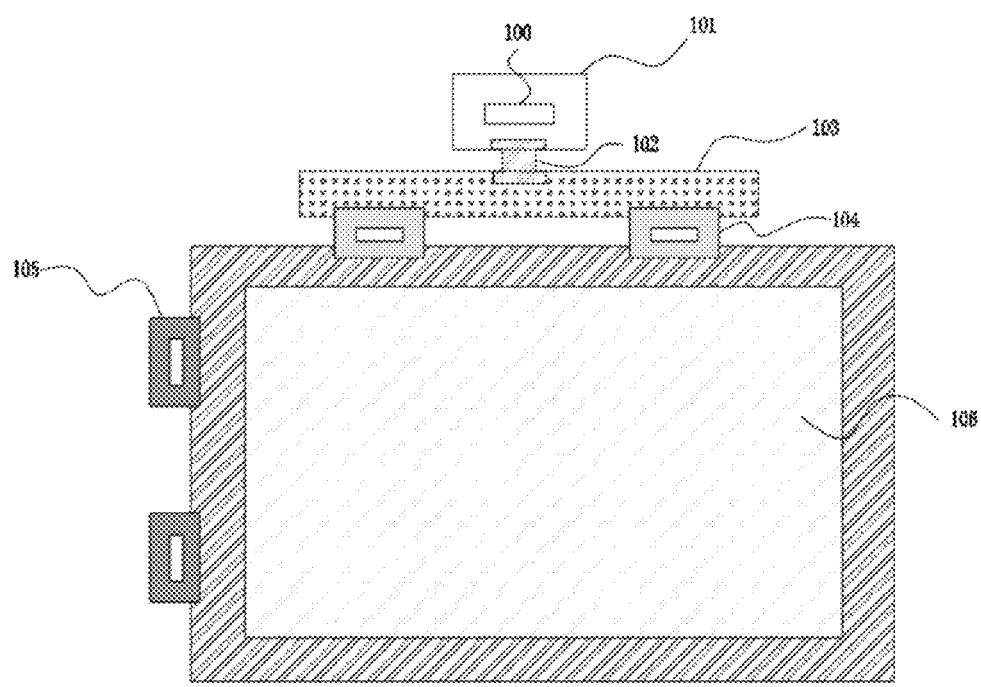
FIG. 1 is a schematic architectural diagram of an example of a display apparatus.

FIG. 1 is a schematic architectural diagram of an example of a display apparatus. The display apparatus includes: a control panel 100. The control panel 100 includes a timing control unit 101 (Timing Controller, TCON) 101; and a printed circuit board 103, connected to the control panel by using a flexible flat cable (FFC) 102. A source driving circuit 104 and a gate driving circuit 105 are respectively connected to a data line and a scanning line in a display area 106. In some embodiments, the gate driving circuit 105 and the source driving circuit 104 include, but are not limited to, a chip-on-film form.

In some embodiments, a main driving manner of the display apparatus includes: A system mainboard provides and transmits a color (such as red/green/blue (R/GB)) compression signal, a control signal, and a power supply to the control panel 100. After the timing unit 101 of the control panel 100 processes such signals, the signals together with the power supply processed by the driving circuit are transmitted to the source driving circuit 104 and the gate driving circuit 105 of the printed circuit board 103 by using, for example, the flexible flat cable 102. The source driving circuit 104 and the gate driving circuit 105 transmit necessary data and the power supply to the display area 106 by using a gate line and a source line, so that a display obtains the power supply and the signals required for presenting an image.

Figure 2:
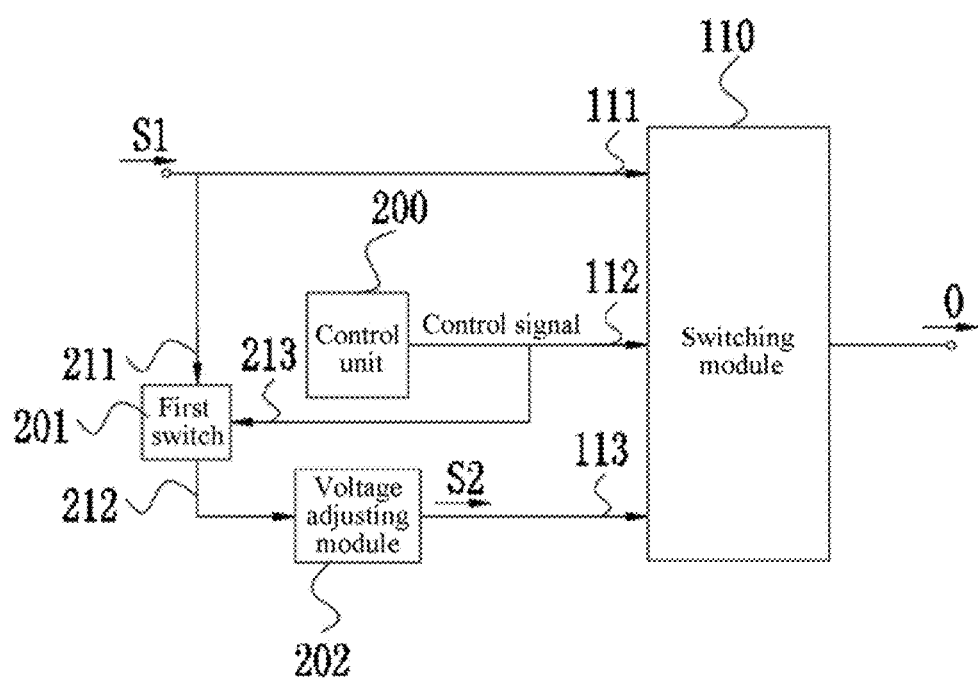
FIG. 2 is a schematic diagram of a driving circuit of a display apparatus according to an embodiment of this application.

FIG. 2 is a schematic diagram of a driving circuit of a display apparatus according to an embodiment of this application. In an embodiment of this application, the driving circuit of a display apparatus includes: a switching module 110, including a control line 112, a first input line 111, a second input line 113, and an output line; a control unit 200, where an output end of the control unit 200 is connected to the control line 112 of the switching module 110; a first switch 201, where a control end of the first switch 201 is connected to the control line 112 of the switching module 110, and a first end of the first switch 201 is connected to the first input line 111 of the switching module 110; and a voltage adjusting module 202, connected between a second end of the first switch 201 and the second input line 113 of the switching module 110. The first input line 111 of the switching module 110 is electrically coupled to a first signal S1. The control unit 200 provides a control signal. When the control signal is at a first potential, the switching module 110 performs circuit switching to enable the output line of the switching module 110 to electrically communicate with a first input line of the switching module 110, and an output signal 0 of the output line of the switching module 110 is equal or close to the first signal S1. When the control signal is at a second potential, the switching module 110 performs circuit switching to enable the output line of the switching module 110 to electrically communicate with the second input line 113 of the switching module 110, the first switch 201 is turned on, the voltage adjusting module 202 adjusts the first signal S1 to a second signal S2 and outputs the second signal S2 to the second input line 113 of the switching module 110, and the output signal 0 of the output line of the switching module 110 is equal or close to the second signal S2.

Figure 3:
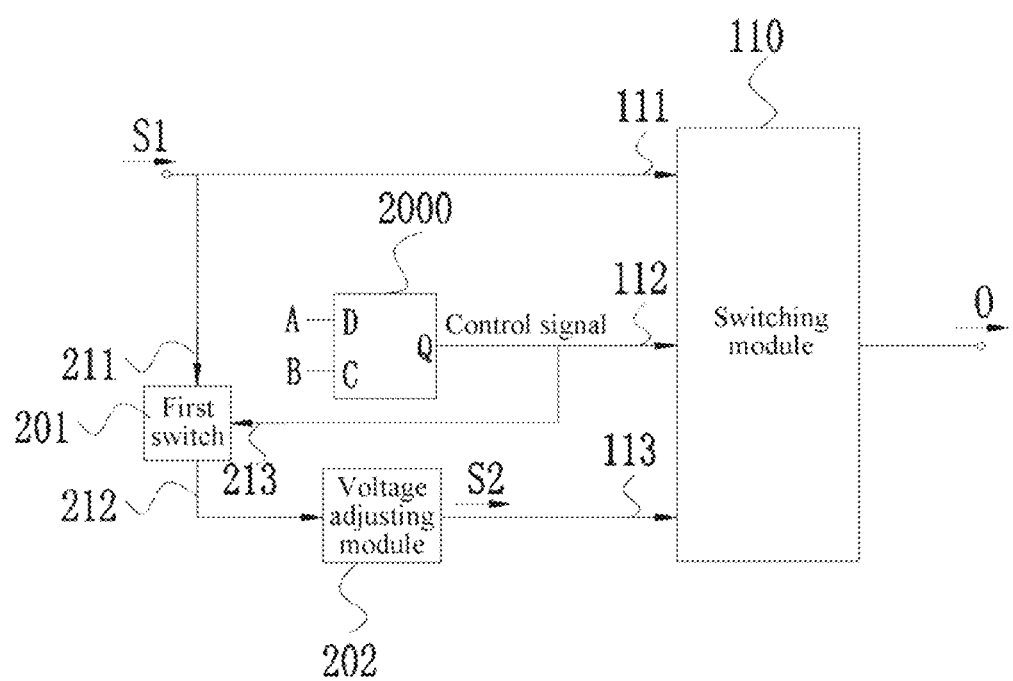
FIG. 3 is a schematic diagram of a driving circuit of a display apparatus according to an embodiment of this application.

FIG. 3 is a schematic diagram of a driving circuit of a display apparatus according to an embodiment of this application. In an embodiment of this application, the control unit is a D-type flip-flop 2000, including a digital signal input end D, a trigger signal input end C, and a signal output end Q. The signal output end Q of the D-type flip-flop 2000 is connected to the control line 112 of the switching module 110, the digital signal input end D receives an input signal A, and the trigger signal input end C receives a pulse signal B. When the pulse signal B is at a third potential, the digital signal input end D assigns the input signal A to the signal output end Q of the D-type flip-flop 2000, and the signal output end Q of the D-type flip-flop 2000 outputs the input signal A. When the pulse signal B is at a fourth potential, the signal output end Q of the D-type flip-flop 2000 has no output.

Figure 4:
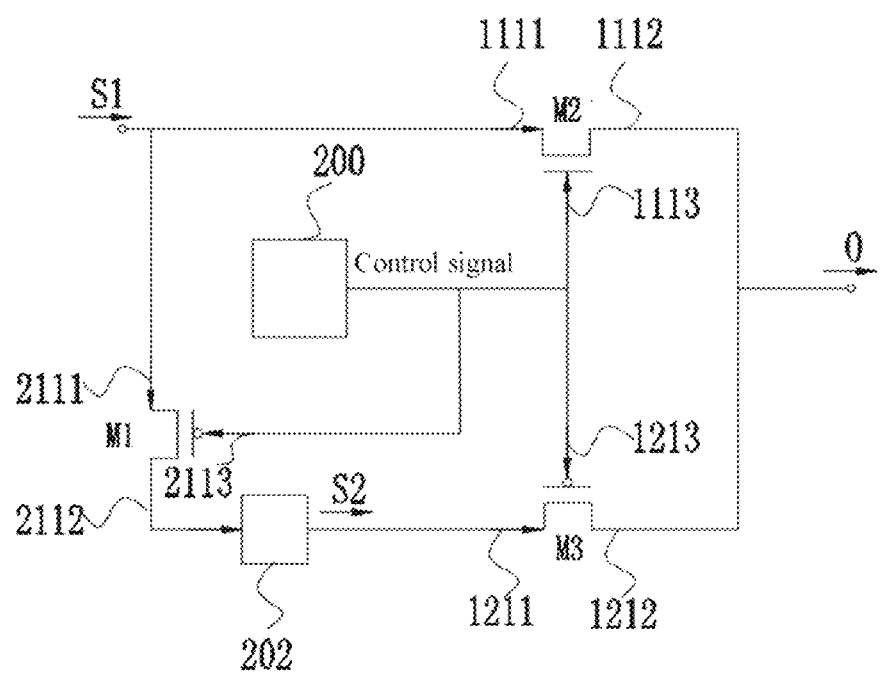
FIG. 4 is a schematic diagram of a driving circuit of a display apparatus according to an embodiment of this application.

FIG. 4 is a schematic diagram of a driving circuit of a display apparatus according to an embodiment of this application. In an embodiment of this application, the switching module 110 includes: a second switch, where the second switch is an N-type field-effect transistor M2, a first end 1111 of the N-type field-effect transistor M2 is the first input line 111 of the switching module 110, and a second end 1112 of the N-type field-effect transistor M2 is connected to the output line of the switching module 110; and a third switch, where the third switch is a P-type field-effect transistor M3, a first end 1211 of the P-type field-effect transistor M3 is the second input line 113 of the switching module 110, and a second end 1212 of the P-type field-effect transistor M3 is connected to the output line of the switching module 110. The first switch 201 is a P-type field-effect transistor M1, the first potential is a high potential, and the second potential is a low potential.

In an embodiment of this application, the first switch 201 is an N-type field-effect transistor, the second switch 1101 is a P-type field-effect transistor, and the third switch 1102 is a N type field-effect transistor. In this case, the first potential is a low potential, and the second potential is a high potential.

In an embodiment of this application, both the first signal S1 and the second signal S2 are voltage signals, and a voltage of the first signal S1 is higher than a voltage of the second signal S2.

Figure 5:
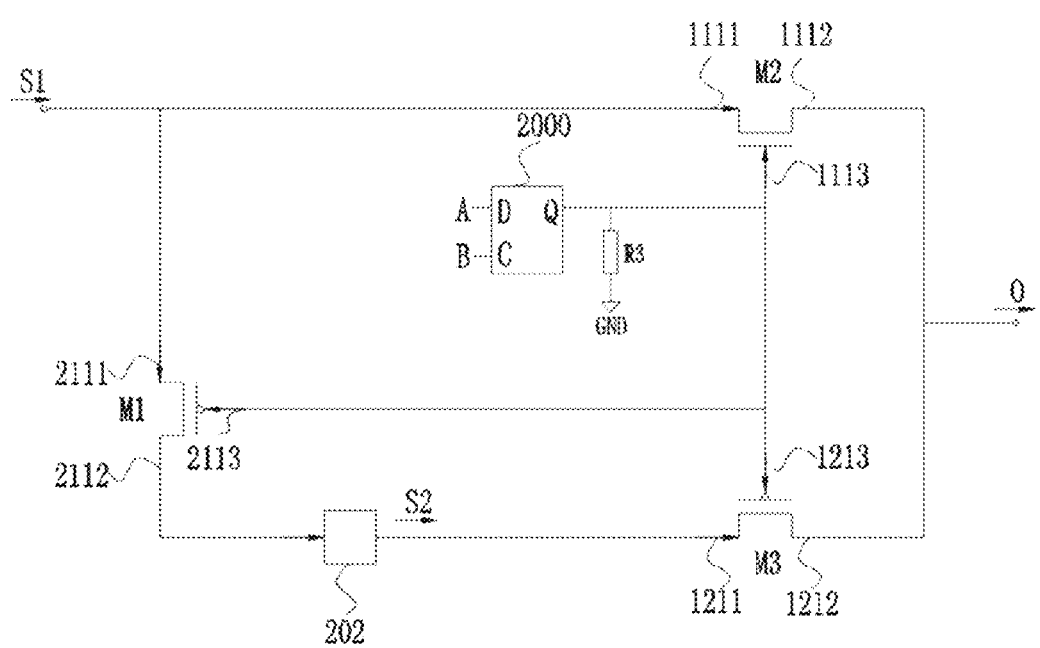
FIG. 5 is a schematic diagram of a driving circuit of a display apparatus according to an embodiment of this application.

FIG. 5 is a schematic diagram of a driving circuit of a display apparatus according to an embodiment of this application. In an embodiment of this application, the driving circuit of a display apparatus includes: a D-type flip-flop 2000, including a digital signal input end D, a trigger signal input end C, and a signal output end Q, where the digital signal input end D receives an input signal A, and the trigger signal input end C receives a pulse signal B; a P-type field-effect transistor M1, where a first end 2111 of the P-type field-effect transistor M1 is connected to a first node, and a control end of the P-type field-effect transistor M1 is connected to the signal output end Q; an N-type field-effect transistor M2, where a first end 1111 of the N-type field-effect transistor M2 is connected to the first node, a control end of the N-type field-effect transistor M2 is connected to the signal output end Q, and a second end 1112 of the N-type field-effect transistor M2 is connected to the second node; a P-type field-effect transistor M3, where a control end of the P-type field-effect transistor M3 is connected to the signal output end Q, and a second end 1212 of the P-type field-effect transistor M3 is connected to the second node; a third resistor R3, where a first end of the third resistor R3 is connected to the signal output end Q of the D-type flip-flop 2000, and a second end of the third resistor R3 is grounded; and a voltage adjusting module 202, where an input end of the voltage adjusting module 202 is connected to a second end 2112 of the P-type field-effect transistor M1, an output end of the voltage adjusting module 202 is connected to a first end 1211 of the P-type field-effect transistor M3. The first node is electrically coupled to a first signal S1, and the second node is electrically coupled to an output signal O.

The first node obtains the first signal S1, the pulse signal B is at a high potential, the signal output end Q of the D-type flip-flop 2000 outputs the input signal A, and when the input signal A is at a high potential, the N-type field-effect transistor M2 is turned on, the P-type field-effect transistor M1 and the P-type field-effect transistor M3 are turned off, and the first signal is transmitted to the second node through the N-type field-effect transistor M2. In this case, O=S1. When the input signal A is at a low potential, the P-type field-effect transistor M1 and the P-type field-effect transistor M3 are turned on, the N-type field-effect transistor M2 is turned off, the first signal S1 is adjusted by the voltage adjusting module 202 to a second signal S2, and the second signal is transmitted to the second node through the P-type field-effect transistor M3. In this case, O=S2. When the pulse signal B is at a low potential, the signal output end Q of the D-type flip-flop 2000 has no output. In this case, due to grounding of the third resistor, the control ends of the P-type field-effect transistor M1, the N-type field-effect transistor M2, and the P-type field-effect transistor M3 receive a low potential. In this case, O=S2.

Figure 6:
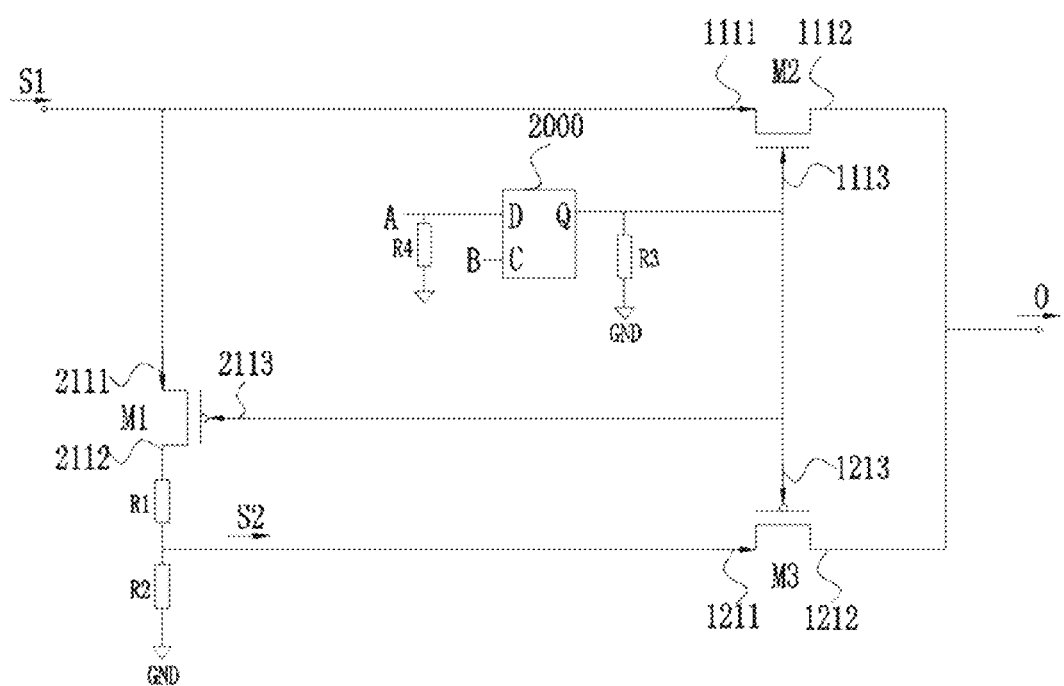
FIG. 6 is a schematic diagram of a driving circuit of a display apparatus according to an embodiment of this application.

FIG. 6 is a schematic diagram of a driving circuit of a display apparatus according to an embodiment of this application. In an embodiment of this application, the voltage adjusting module 202 includes: a first resistor R1, where a first end of the first resistor R1 is connected to the second end 2112 of the P-type field-effect transistor M1, and a second end of the first resistor R1 is connected to the first end 1211 of the P-type field-effect transistor M3; a second resistor R2, where a first end of the second resistor R2 is connected to the second end of the first resistor R1, and a second end of the second resistor R2 is grounded; a third resistor R3, where a first end of the third resistor R3 is connected to the signal output end Q of the D-type flip-flop 2000, and a second end of the third resistor R3 is grounded; and a fourth resistor R4, where a first end of the fourth resistor R4 is connected to the digital signal input end D, and a second end of the fourth resistor R4 is grounded. The D-type flip-flop 2000 is triggered during a rising edge.

The first node obtains the first signal S1, the pulse signal B is at a high potential, the signal output end Q of the D-type flip-flop 2000 outputs the input signal A, and when the input signal A is at a high potential, the N-type field-effect transistor M2 is turned on, and the P-type field-effect transistor M1 and the P-type field-effect transistor M3 are turned off. In this case, VGH=VGH1. When the input signal A is at a low potential, the P-type field-effect transistor M1 and the P-type field-effect transistor M3 are turned on, and the N-type field-effect transistor M2 is turned off. In this case, $O=S2=S1*R2/(R1+R2)$. When the pulse signal B is at a low potential, the signal output end Q of the D-type flip-flop 2000 has no output. Due to grounding of the fourth resistor R4, the control ends of the P-type field-effect transistor M1, the N-type field-effect transistor M2, and the P-type field-effect transistor M3 receive a low potential. In this case, $O=S2=S1*R2/(R1+R2)$.

According to this application, a gate turn-on voltage may be increased to perform an aging test on a display panel without greatly changing an existing production process, thereby improving the product quality and reduce the production costs.

In some embodiments, the display panel in the present utility model may be, for example, a liquid crystal display panel, but is not limited thereto. The display panel may also be an OLED display panel, a W-OLED display panel, a QLED display panel, a plasma display panel, a curved display panel, or a display panel of another type.

The wordings such as "in some embodiments" and "in various embodiments" are repeatedly used. The wordings usually refer to different embodiments, but they may also refer to a same embodiment. The words, such as "comprise", "have", and "include", are synonyms, unless other meanings are indicated in the context thereof.

The foregoing descriptions are merely embodiments of this application, and are not intended to limit this application in any form. Although this application has been disclosed above through the specific embodiments, the embodiments are not intended to limit this application. Any person skilled in the art can make some variations or modifications, which are equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. A driving circuit of a display apparatus, comprising:
   a switching module, comprising a control line, a first input line, a second input line, and an output line;
   a control unit, wherein an output end of the control unit is connected to the control line of the switching module;
   a first switch, wherein a control end of the first switch is connected to the control line of the switching module, and a first end of the first switch is connected to the first input line of the switching module; and
   a voltage adjusting module, connected between a second end of the first switch and the second input line of the switching module, wherein
   the first input line of the switching module is electrically coupled to a first signal, the control unit provides a control signal, and when the control signal is at a first potential, the switching module performs circuit switching to enable the output line of the switching module to electrically communicate with a first input line of the switching module, and an output signal of the output line of the switching module is equal or close to the first signal; and
   when the control signal is at a second potential, the switching module performs circuit switching to enable the output line of the switching module to electrically communicate with the second input line of the switching module, the first switch is turned on, the voltage adjusting module adjusts the first signal to a second signal and outputs the second signal to the second input line of the switching module, and the output signal of the output line of the switching module is equal or close to the second signal.

2. The driving circuit of a display apparatus according to claim 1, wherein
   the switching module comprises:
   a second switch, wherein a first end of the second switch is the first input line of the switching module, and a second end of the second switch is connected to the output line of the switching module; and
   a third switch, wherein a first end of the third switch is the second input line of the switching module, and a second end of the third switch is connected to the output line of the switching module, wherein
   control ends of the second switch and the third switch have opposite polarities, and are connected to the control line of the switching module.

3. The driving circuit of a display apparatus according to claim 2, wherein polarities of control ends of the first switch and the third switch are the same.

4. The driving circuit of a display apparatus according to claim 2 wherein the first switch and the third switch are P-type field-effect transistors, and the second switch is an N-type field-effect transistor.

5. The driving circuit of a display apparatus according to claim 4, wherein the first potential is a high potential, and the second potential is a low potential.

6. The driving circuit of a display apparatus according to claim 1, wherein the control unit is a flip-flop, the flip-flop comprises a digital signal input end, a trigger signal input end, and a signal output end, the signal output end of the flip-flop is connected to the control line of the switching module, the digital signal input end receives an input signal, and the trigger signal input end receives a pulse signal.

7. The driving circuit of a display apparatus according to claim 6, wherein when the pulse signal is at a third potential, the digital signal input end assigns the input signal to the signal output end of the flip-flop, and the signal output end of the flip-flop outputs the input signal.

8. The driving circuit of a display apparatus according to claim 6, wherein when the pulse signal is at a fourth potential, the signal output end of the flip-flop has no output.

9. The driving circuit of a display apparatus according to claim 6, wherein the flip-flop is a D-type flip-flop.

10. The driving circuit of a display apparatus according to claim 1, wherein the first switch and the third switch are N-type field-effect transistors, and the second switch is a P-type field-effect transistor.

11. The driving circuit of a display apparatus according to claim 10, wherein the first potential is a low potential, and the second potential is a high potential.

12. The driving circuit of a display apparatus according to claim 1, wherein both the first signal and the second signal are voltage signals, and a voltage of the first signal is higher than a voltage of the second signal.

13. A driving circuit of a display apparatus, comprising:
- a flip-flop, comprising a digital signal input end, a trigger signal input end, and a signal output end, wherein the digital signal input end receives an input signal, and the trigger signal input end receives a pulse signal;
- a first switch, wherein a first end of the first switch is connected to a first node, and a control end of the first switch is connected to the signal output end;
- a second switch, wherein a first end of the second switch is connected to the first node, a control end of the second switch is connected to the signal output end, and a second end of the second switch is connected to a second node;
- a third switch, wherein a control end of the third switch is connected to the signal output end, and a second end of the third switch is connected to the second node; and
- a voltage adjusting module, wherein an input end of the voltage adjusting module is connected to a second end of the first switch, and an output end of the voltage adjusting module is connected to a first end of the third switch, wherein
- the first node is electrically coupled to a first signal, and the second node is electrically coupled to an output signal;
- the first node obtains the first signal, the pulse signal is at a high potential, the signal output end of the flip-flop outputs the input signal, and when the input signal is at a high potential, the second switch is turned on, the first switch and the third switch are turned off, and the first signal is transmitted to the second node through the second switch;
- when the input signal is at a low potential, the first switch and the third switch are turned on, the second switch is turned off, the first signal is adjusted by the voltage adjusting module to a second signal, and the second signal is transmitted to the second node through the third switch; and
- when the pulse signal is at a low potential, the signal output end of the flip-flop has no output.

14. The driving circuit of a display apparatus according to claim 13, wherein the flip-flop is a D-type flip-flop.

15. The driving circuit of a display apparatus according to claim 13, wherein the first switch and the third switch are P-type field-effect transistors, and the second switch is an N-type field-effect transistor.

16. The driving circuit of a display apparatus according to claim 13, wherein both the first signal and the second signal are voltage signals, and a voltage of the first signal is higher than a voltage of the second signal.

17. The driving circuit of a display apparatus according to claim 13, wherein the voltage adjusting module comprises:
- a first resistor, wherein a first end of the first resistor is connected to the second end of the first switch, and a second end of the first resistor is connected to the first end of the third switch; and
- a second resistor, wherein a first end of the second resistor is connected to the second end of the first resistor, and a second end of the second resistor is grounded.

\* \* \* \* \*